US 6,717,497 B2

United States Patent
Atkins

(10) Patent No.: US 6,717,497 B2
(45) Date of Patent: Apr. 6, 2004

(54) MOUNTING SCHEME FOR NMR GRADIENT MAGNET COILS

(75) Inventor: Andrew Farquhar Atkins, Oxford (GB)

(73) Assignee: Oxford Magnet Technology Limited, Oxford (GB)

(*) Notice: Subject to any disclaimer, the term of this patent is extended or adjusted under 35 U.S.C. 154(b) by 0 days.

(21) Appl. No.: 10/347,274

(22) Filed: Jan. 21, 2003

(65) Prior Publication Data
US 2003/0137379 A1 Jul. 24, 2003

(30) Foreign Application Priority Data
Jan. 21, 2002 (GB) .............................................. 0201254

(51) Int. Cl.[7] .............................. G01R 33/20; H01F 6/00
(52) U.S. Cl. ........................................ 335/216; 324/318
(58) Field of Search ................................ 335/216, 296, 335/299; 324/318–320

(56) References Cited

U.S. PATENT DOCUMENTS

| 4,652,824 A | * | 3/1987 | Oppelt ........................ 324/318 |
| 4,800,354 A | * | 1/1989 | Laskaris ..................... 335/216 |
| 4,954,781 A | * | 9/1990 | Hirata ........................ 324/318 |
| 5,345,177 A |   | 9/1994 | Sato et al. .................. 324/318 |

FOREIGN PATENT DOCUMENTS

WO  02/44745  6/2002

* cited by examiner

Primary Examiner—Ramon M. Barrera
(74) Attorney, Agent, or Firm—Crowell & Moring LLP

(57) ABSTRACT

The present invention relates to the mounting of magnet coils as used in Nuclear Magnetic Resonance systems. In particular, the mounting scheme is relevant to gradient magnet assembly of such systems. Using the present invention hard contact between gradient magnet assembly and a cryostat does not occur. This allows a reduction in the transmission of mechanical vibrations and any resultant disturbance. Furthermore vibration of the gradient magnet assembly is reduced enabling improved system performances.

9 Claims, 4 Drawing Sheets

MOUNTING SCHEME FOR NMR GRADIENT MAGNET COILS

FIELD OF THE INVENTION

The present invention relates to a mounting scheme for a gradient magnet assembly, as used in Nuclear Magnetic Resonance (NMR) devices such as Magnetic Resonance Imaging (MRI) apparatus. In particular, but not restricted thereto, the present invention relates to a method of mounting annular coils to a cylindrical structure.

BACKGROUND TO THE INVENTION

In typical NMR apparatus, first and second magnetic coil systems are arranged coaxially with respect to a longitudinal axis defined by a field direction of a homogenous magnetic field generated by the first magnetic coil system. The second magnet coil system comprises a gradient magnet assembly, which is operable to effect pre-defined magnetic fields about a patient/sample: the effect of the patient/sample on the magnetic field is monitored whereby to provide a magnetic resonant image. In MRI systems such an image can comprise a section through a patient. In non-medical NMR systems, such an image can indicate the presence of certain elements. The first magnetic system may further comprise a shielding set of magnets.

MRI is becoming an increasingly accepted diagnostic procedure in medicine. FIGS. 1 and 2 schematically show an MRI apparatus in perspective and part cross-sectional views. The apparatus has an outer skin 10 which comprises an external wall of a cryogenic insulating environment (cryostat) for the super-conducting magnet coils which produce a primary magnetic field, which operate at extremely low temperatures, such as four Kelvin. Within the cryostat are placed primary magnetic coils 16. The length L of the wall of the cryostat is typically around 1.5 m for whole body scanners. The gradient magnet assembly 14 is fixed to the inside wall of the cryostat. A gradient magnet assembly will typically comprise gradient magnet coils that are arranged orthogonally and may comprise three sets: one set for each of the orthogonal directions or six sets: two for each of the orthogonal directions. Other configurations of gradient magnets are possible. In operation the gradient coils are supplied with large currents, which are switched rapidly on and off to provide position encoding data necessary for the imaging process. In the presence of the strong primary magnetic field the resulting forces on the gradient coils cause substantial noise and vibration.

Conventionally, rigid mounts 18 in the form of wedges have been employed to separate and retain physically the gradient assembly from the inside of the cryostat wall. Such wedges do not isolate the cryostat from the mechanical vibrations associated with the gradient assembly. This can lead to vibrations being set up within the cryostat structure which can lead to a deterioration of the performance of the imaging system as a result of the effect of eddy currents induced when the conducting surfaces within the cryostat are moved relative to the primary magnetic field. It can also lead to an increase in the level of acoustic noise produced as the surfaces of the cryostat are vibrated. The rigid wedges may alternatively be replaced by resilient rubber mounts. Nevertheless, the need for the gradient assembly to be held firmly within the system means that no improvement has been found to be substantial.

Alternatively, the gradient assembly is supported with respect to a floor, separately from the support feet of the cryostat. This has the effect of lengthening the system: long systems tend not to be patient-friendly since confined diagnostic spaces can be distressing to some patients. Still other systems provide stiffness in one support direction and a much reduced stiffness in another direction.

Thus noise transmission paths from the gradient assembly and the mechanical mounts of the gradient assembly can be a significant problem.

OBJECT TO THE INVENTION

The present invention seeks to provide an improved mounting system for magnets and, in particular, gradient magnet assembly for MRI apparatus.

STATEMENT OF INVENTION

In accordance with a first aspect of the invention there is provided a magnetic resonance imaging apparatus comprising a primary superconducting magnet, a cryostat and a gradient magnet assembly; wherein the primary superconducting magnet is contained within the cryostat and, wherein the gradient magnet assembly is spaced from and indirectly attached to the cryostat by tensionable straps. In a preferred embodiment the gradient magnet assembly is supported by straps wrapped around the cryostat. Conveniently these straps comprise a braided material. Alternatively the material may comprise a band, wire or ropes. Braided material or band material (whether woven or otherwise) may be manufactured from a steel such as a stainless steel, carbon fibre, polyamide, Kevlar (RTM) or other suitable material.

The MRI apparatus can comprise a tubular magnet, employing one or more solenoid coils. These solenoid coils may be arranged in a nested fashion, or extend along a longitudinal axis.

The straps may be configured whereby one or more surrounds a section of the cylindrical bore. The straps may be configured such that they extend about the inside of the bore, being connected at either end with the bore.

Thus, the invention can provide a mounting system for a tubular magnet within a bore, wherein the gradient magnet assembly is supported adjacent a wall of the bore by an arrangement of straps, the straps being configured and tensioned whereby to prevent direct contact of the gradient magnet assembly with a wall of the bore.

In an MRI magnet apparatus, a gradient magnet can thus be substantially dynamically de-coupled from a cryostat, without floor mounting.

BRIEF DESCRIPTION OF THE FIGURES

For a better understanding of the invention and to show how the same may be carried into effect, reference shall now be made to the accompanying Figures, as shown in the accompanying drawing sheets, wherein.

DETAILED DESCRIPTION OF THE INVENTION

There will now be described by way of example the best mode contemplated by the inventors for carrying out the invention. In the following description numerous specific details are set forth in order to provide a thorough understanding of the present invention. It will be apparent, however, to one skilled in the art, that the present invention may be practised without using these specific details. In other instances, well known methods and structures have not been described in detail so as not to obscure the present invention unnecessarily.

Figure 1:
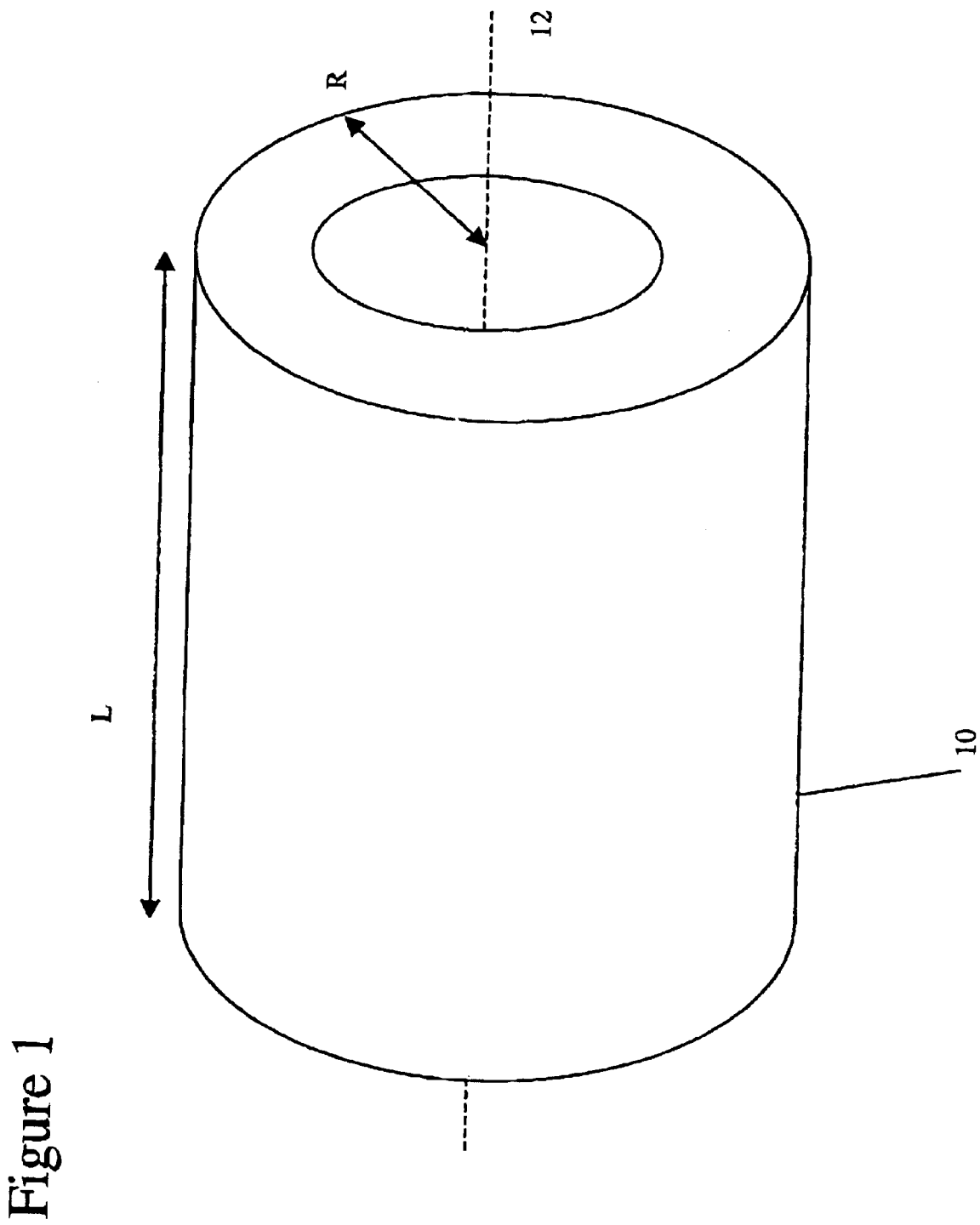
FIG. 1 is a perspective view of a tubular cryostat arrangement of a solenoid magnet MRI apparatus.
Figure 2:
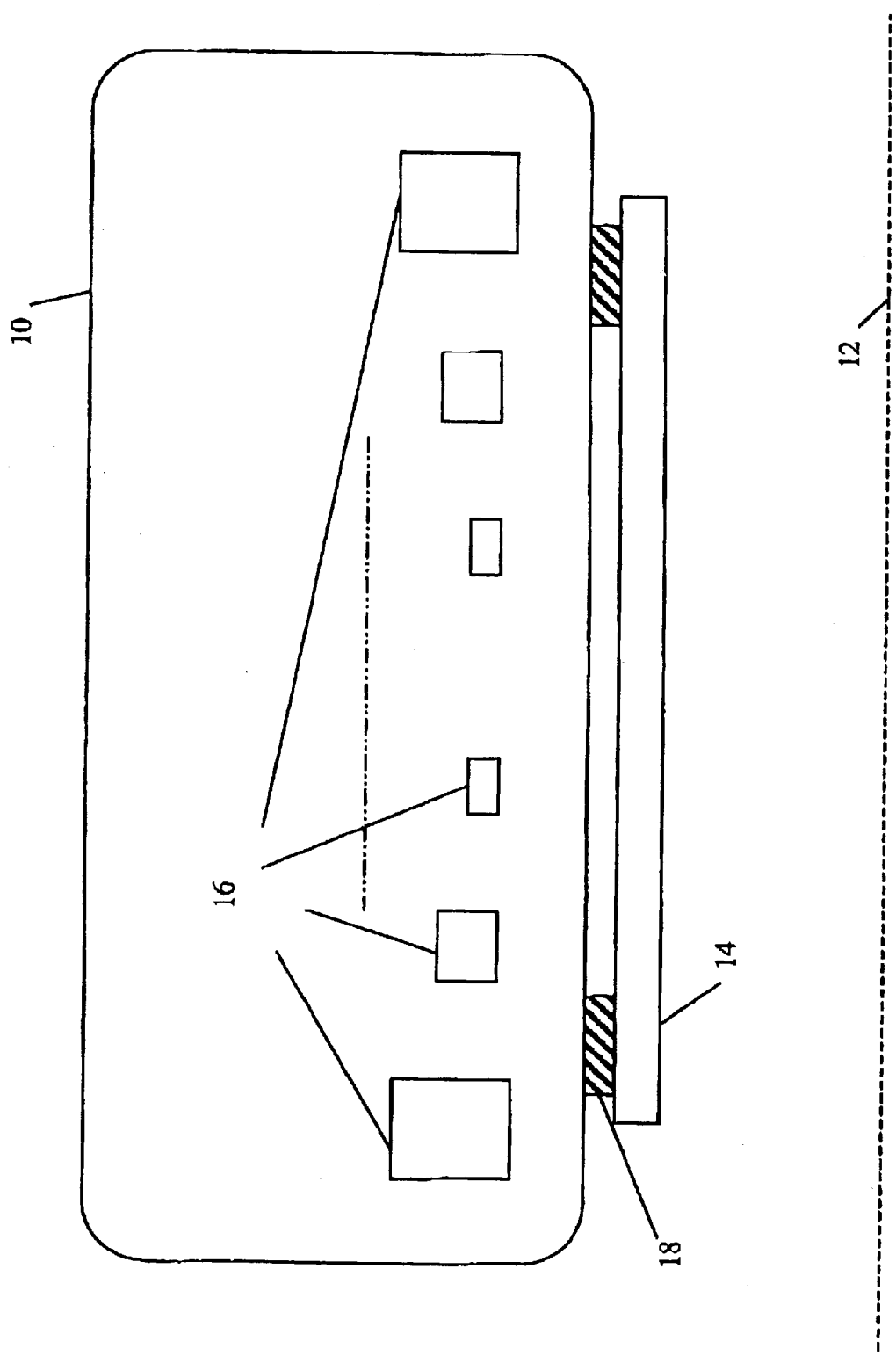
FIG. 2 shows a section through an upper half of a cryostat of the type shown in FIG. 1 with a prior art attachment of a gradient magnet assembly.
Figure 3:
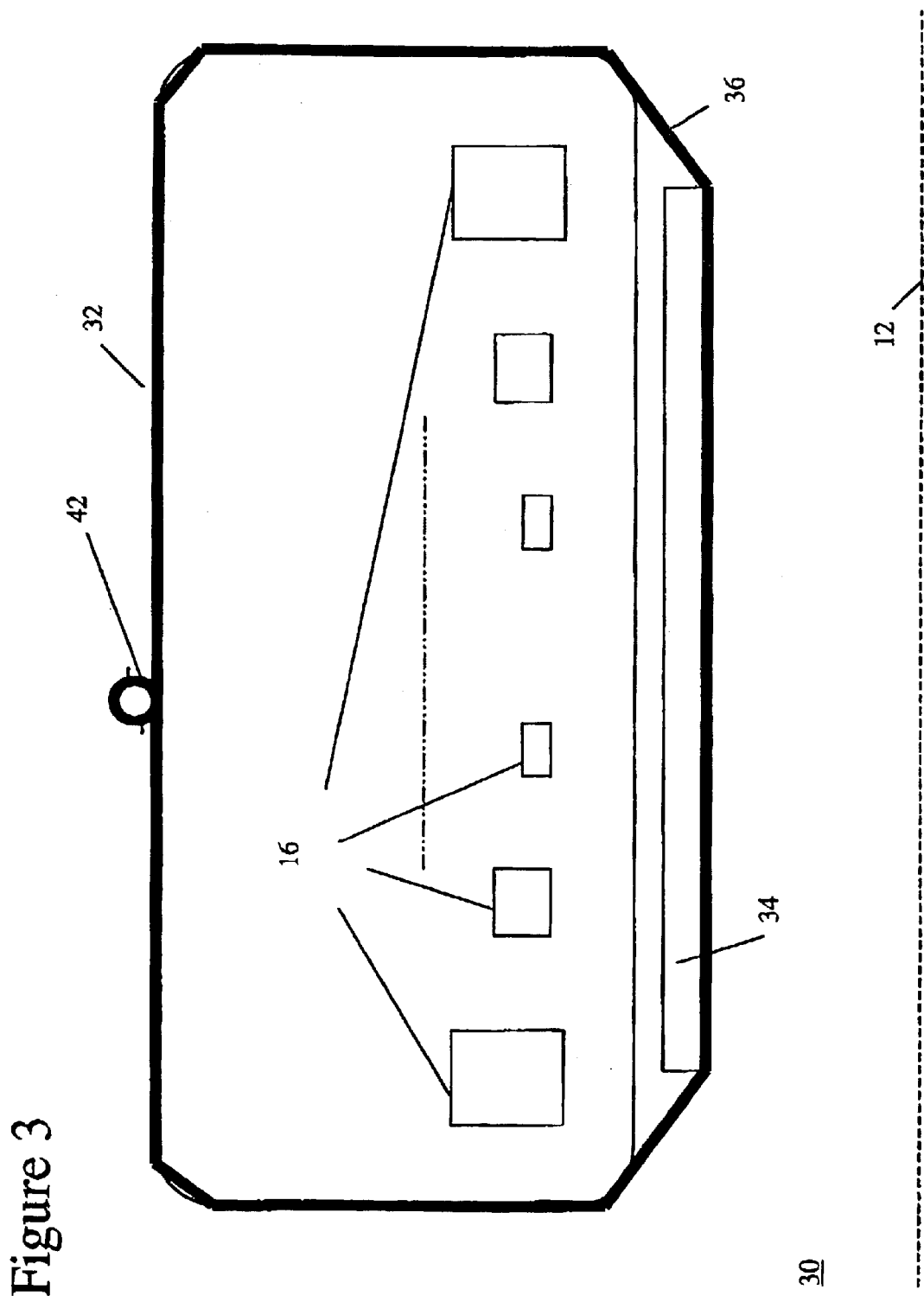
FIG. 3 shows a section through an upper half of a cryostat cryostat of the type shown in FIG. 4 in accordance with a first embodiment of the invention.
Figure 4:
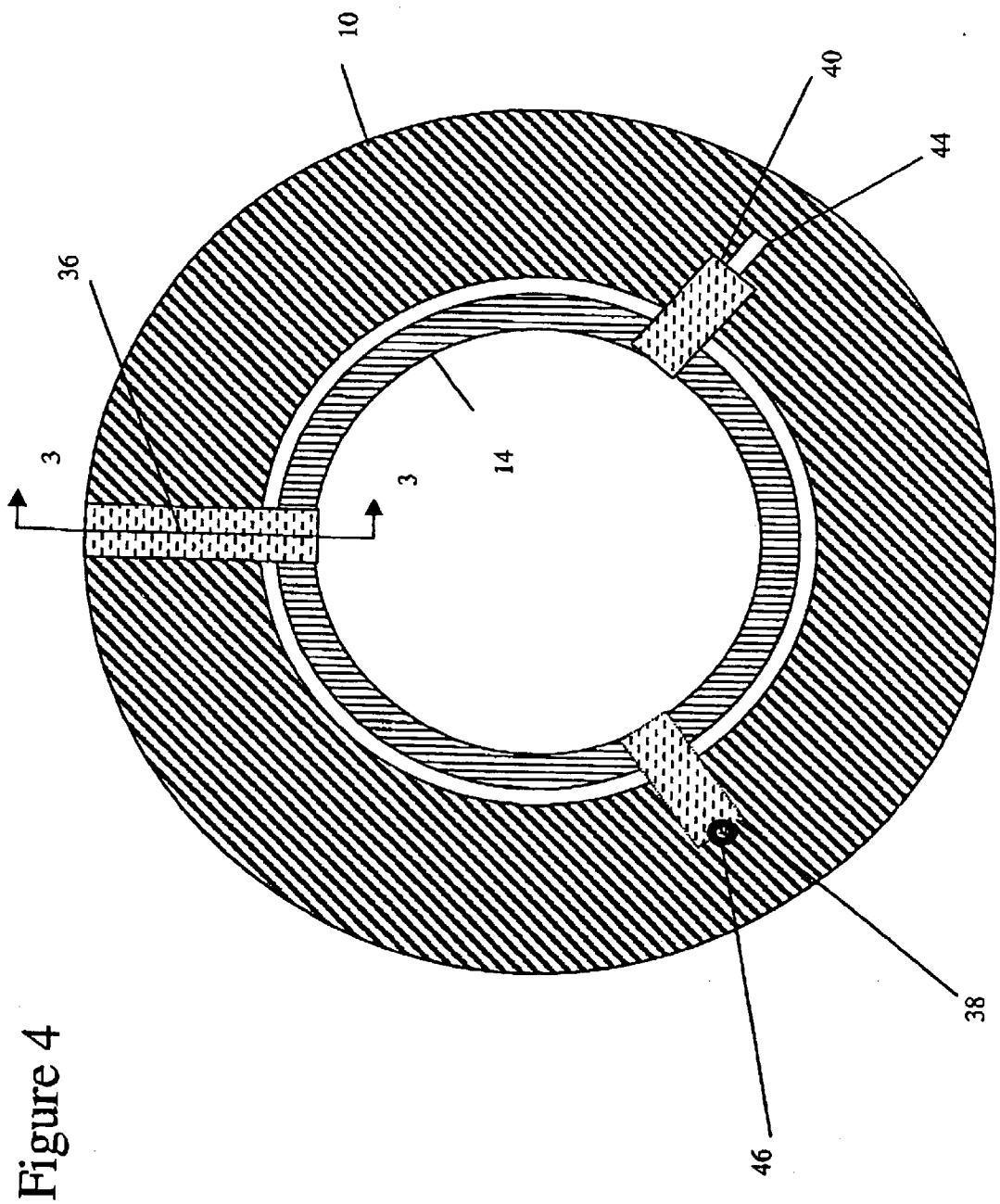
FIG. 4 shows an end view of the first embodiment with three different straps.

Referring now to FIGS. 3 and 4, there is shown a first embodiment of the invention. FIG. 3 is a cross-section 30 through the cylindrical coil—cryostat arrangement of FIG. 4. The cryostat 32 has an inner gradient coil 34 which is held in place by strap 36. The arrangement of straps 36, 38 and 40 are arranged to support the gradient magnet assembly concentrically within an open inner bore defined by the cryostat outer wall. Typically a central axis of the gradient magnet assembly will lie along a central axis of the cryostat, but the support for the gradient magnet assembly does not preclude variations from this should any specific design require a particular orientation of the gradient magnet assembly.

Strap 36 is tensioned by a ratchet tensioning means 42, as is known, although other forms operable to tension the straps such as screw tensioning means, such as a bottle-screw, 44 (shown in relation to strap 40) are possible. Strap 38 is shown without a specific form of tensioning means, but shows a ring like connection with cryostat 10. It will be appreciated that forces applied by a strap must balance either end of the gradient magnet assembly or otherwise distortion of the apparatus will arise. FIG. 4 shows the various tensioning means for example only: it is expected that only one type of tensioning means would be employed in a particular embodiment.

The provision of a separate tensioning means on every strap gives a great deal of flexibility in adjusting the position of the gradient magnet assembly relative to the cryostat. This degree of flexibility is not always necessary, and some of the straps could be of a fixed or preset length, with only one strap being provided with a means of tensioning.

Conveniently straps are employed: this enables the simplest structure with respect to obtaining a balance in support forces. At least two straps are needed to ensure stability of he gradient magnet assembly, with the preferred number being three or four. However, a greater number is also possible. Whilst an increase in the number, of straps would be beneficial in reducing the risk of distortion, the manufacture of the magnet assembly would become more complicated and could make servicing of the apparatus more difficult and servicing of the gradient magnet assembly particularly difficult. The straps may comprise banding, braiding, wire, rope or similar, made from metals such as steel (preferably stainless steel) or other materials such as carbon fibre. Woven bands may also be employed, as may reinforced tape. Ductility must be of an extremely low order, whilst the strap must be sufficiently flexible to enable support and the minimal transmission of vibrations.

As is clear from FIG. 3 strap 36 is supported at an angle of about 45° to the vertical plane/radial plane relative to axis 12. This enables the gradient magnets to be simply and easily mounted so that it is resilient to axial and radial (transverse) displacement. Further, the use of tensioned straps enables the straps to be tuned whereby the vibration response in the frequency range of interest is minimised.

Strap 38 indicates an alternative embodiment of the invention where the straps do not form a complete loop around the cryostat and anchored to themselves, but are instead anchored to some part of the cryostat structure away from the bore tube, and which may be specially reinforced and stiffened for that purpose. Such a fixing point may, for example, be the point on the cryostat where the internal suspension components which support the magnet coils are anchored. Although the strap provides significant damping of any vibration generated by the gradient magnets such a fixing point should be chosen so that any residual vibration is minimally coupled into the cryostat structure.

The present invention provides a means for the support of the gradient magnet assembly whilst minimising the transmission of vibration from the cryostat to the gradient magnet assembly, particularly the magnets. The straps, by not being rigid, damp vibration furthermore by not being in direct contact with the warm bore of the cryostat, so disturbances within the cryostat are reduced. This results in a substantial decrease in the level of acoustic noise generated by the system.

What is claimed is:

1. A magnetic resonance imaging apparatus comprising a primary super-conducting magnet, a cryostat and a gradient magnet assembly:

wherein the primary super-conducting magnet is contained within the cryostat; and, wherein the gradient magnet assembly is spaced from, and indirectly attached to, the cryostat by flexible straps that are under tension.

2. A magnetic resonance imaging apparatus according to claim 1 wherein the straps are selected from the group consisting of braided material, woven band material, solid band material and reinforced tape.

3. A magnetic resonance imaging apparatus according to claim 1, wherein the apparatus comprises a tubular solenoid magnet.

4. A magnetic resonance imaging apparatus according to claim 1 wherein the tensioning means comprises one of a ratchet mechanism, a screw tensioning means.

5. A magnetic resonance imaging apparatus comprising a primary super-conducting magnet, a cryostat and a gradient magnet assembly:

wherein the primary super-conducting magnet is contained within the cryostat;

wherein the gradient magnet assembly is spaced from, and indirectly attached to, the cryostat by flexible members that are under tension; and wherein the members are selected from the group consisting of wire and rope.

6. A magnetic resonance imaging apparatus according to claim 5, wherein the apparatus comprises a tubular solenoid.

7. A magnetic resonance imaging apparatus according to claim 6, wherein the tensioning means comprises one of a ratchet mechanism, a screw tensioning means.

8. A magnetic resonance imaging apparatus according to claim 1, wherein tensioning of said straps is tuned such that a frequency response of said straps is minimized for a preset frequency range.

9. A magnetic resonance imaging apparatus according to claim 5, wherein tensioning of said flexible members is tuned such that a frequency response of said traps is minimized for a preset frequency range.

* * * * *